United States Patent
Sun et al.

(10) Patent No.: US 8,842,460 B2
(45) Date of Patent: Sep. 23, 2014

(54) METHOD FOR IMPROVING DATA RETENTION IN A 2T/2C FERROELECTRIC MEMORY

(71) Applicant: Ramtron International Corporation, Colorado Springs, CO (US)

(72) Inventors: Shan Sun, Colorado Springs, CO (US); Robert Sommervold, Colorado Springs, CO (US); Thomas E. Davenport, Denver, CO (US); Donald J. Verhaeghe, Colorado Springs, CO (US)

(73) Assignee: Cypress Semiconductor Corporation, San Jose, CA (US)

(*) Notice: Subject to any disclaimer, the term of this patent is extended or adjusted under 35 U.S.C. 154(b) by 46 days.

(21) Appl. No.: 13/685,331

(22) Filed: Nov. 26, 2012

(65) Prior Publication Data

US 2014/0146591 A1    May 29, 2014

(51) Int. Cl.
*G11C 11/22* (2006.01)
*G11C 7/06* (2006.01)

(52) U.S. Cl.
CPC .............. *G11C 11/221* (2013.01); *G11C 7/06* (2013.01)
USPC .......................................... 365/145; 365/148

(58) Field of Classification Search
CPC ..................................................... G11C 11/22
USPC ............... 365/49.13, 65, 109, 117, 145, 148
See application file for complete search history.

(56) References Cited

U.S. PATENT DOCUMENTS

| | | | |
|---|---|---|---|
| 4,893,272 A | 1/1990 | Eaton, Jr. et al. | |
| 5,109,357 A | 4/1992 | Eaton, Jr. | |
| 5,525,528 A | 6/1996 | Perino et al. | |
| 5,532,953 A | 7/1996 | Ruesch et al. | |
| 5,745,403 A | 4/1998 | Taylor | |
| 5,880,989 A | 3/1999 | Wilson et al. | |
| 5,892,728 A | 4/1999 | Allen et al. | |
| 5,912,846 A | 6/1999 | Taylor | |
| 5,956,266 A | 9/1999 | Wilson et al. | |
| 5,969,980 A | 10/1999 | Allen et al. | |
| 5,978,251 A | 11/1999 | Kraus et al. | |
| 5,986,919 A | 11/1999 | Allen et al. | |
| 5,995,406 A | 11/1999 | Kraus et al. | |
| 6,002,634 A | 12/1999 | Wilson | |
| 6,028,783 A | 2/2000 | Allen et al. | |
| 6,147,896 A * | 11/2000 | Kim et al. | 365/145 |
| 6,185,123 B1 | 2/2001 | Allen et al. | |
| 6,252,793 B1 | 6/2001 | Allen et al. | |
| 6,560,137 B2 | 5/2003 | Allen et al. | |
| 6,830,938 B1 | 12/2004 | Rodriguez et al. | |
| 6,856,573 B2 | 2/2005 | Allen et al. | |
| 6,992,911 B2 * | 1/2006 | Takahashi | 365/145 |
| 2004/0090814 A1 * | 5/2004 | Takahashi | 365/145 |

* cited by examiner

*Primary Examiner* — Harry W Byrne

(57) ABSTRACT

A method for improving data retention in a 2T/2C ferroelectric memory includes baking a ferroelectric memory configured to operate as an array of 1T/1C memory cells for a period of time, and then configuring the ferroelectric memory to function as an array of 2T/2C memory cells, wherein the baking pre-imprints the ferroelectric capacitors in the ferroelectric memory and stabilizes a 2T/2C opposite state margin and enhances data retention. A corresponding memory circuit for configuring an array of memory cells for either 1T/1C operation or 2T/2C operation includes a plurality of sense amplifiers, a configurable reference circuit coupled to a logic circuit, a memory array, and a column decoder, wherein components are coupled together through a bit line and a complementary bit line, and wherein the logic circuit can configure the reference circuit for 1T/1C operation or 2T/2C operation.

14 Claims, 16 Drawing Sheets

|  | Pss | Uss | (Psw)ss | Pos | Uos | (Psw)os |
|---|---|---|---|---|---|---|
| 0.01hr | 40 | 20 | 20 | 40 | 20 | 20 |
| 10yr | 40 | 20 | 20 | 28.62 | 31.38 | -2.76 |
| 20yr | 40 | 20 | 20 | 27.92 | 32.08 | -4.16 |

Fig. 5

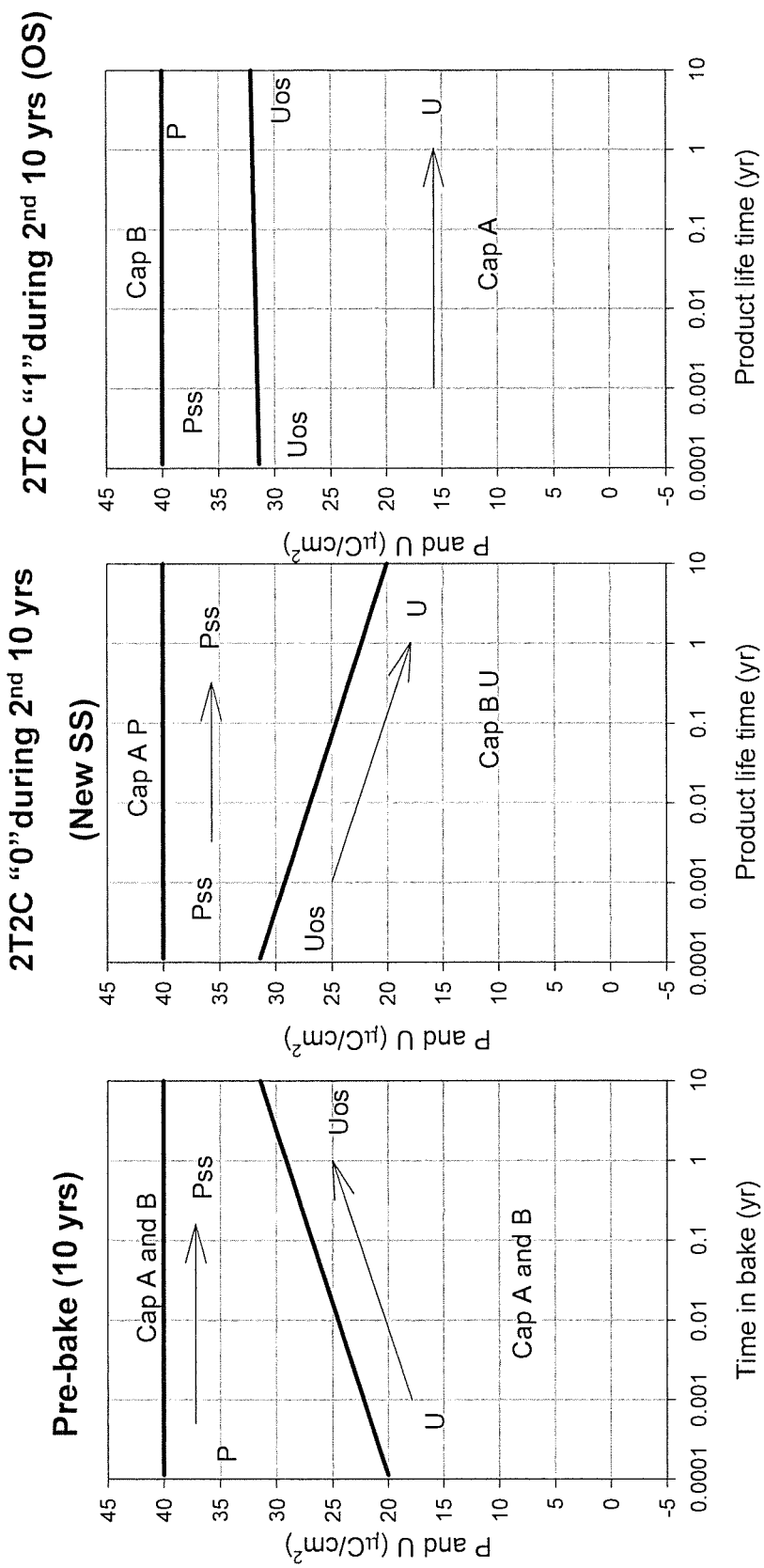

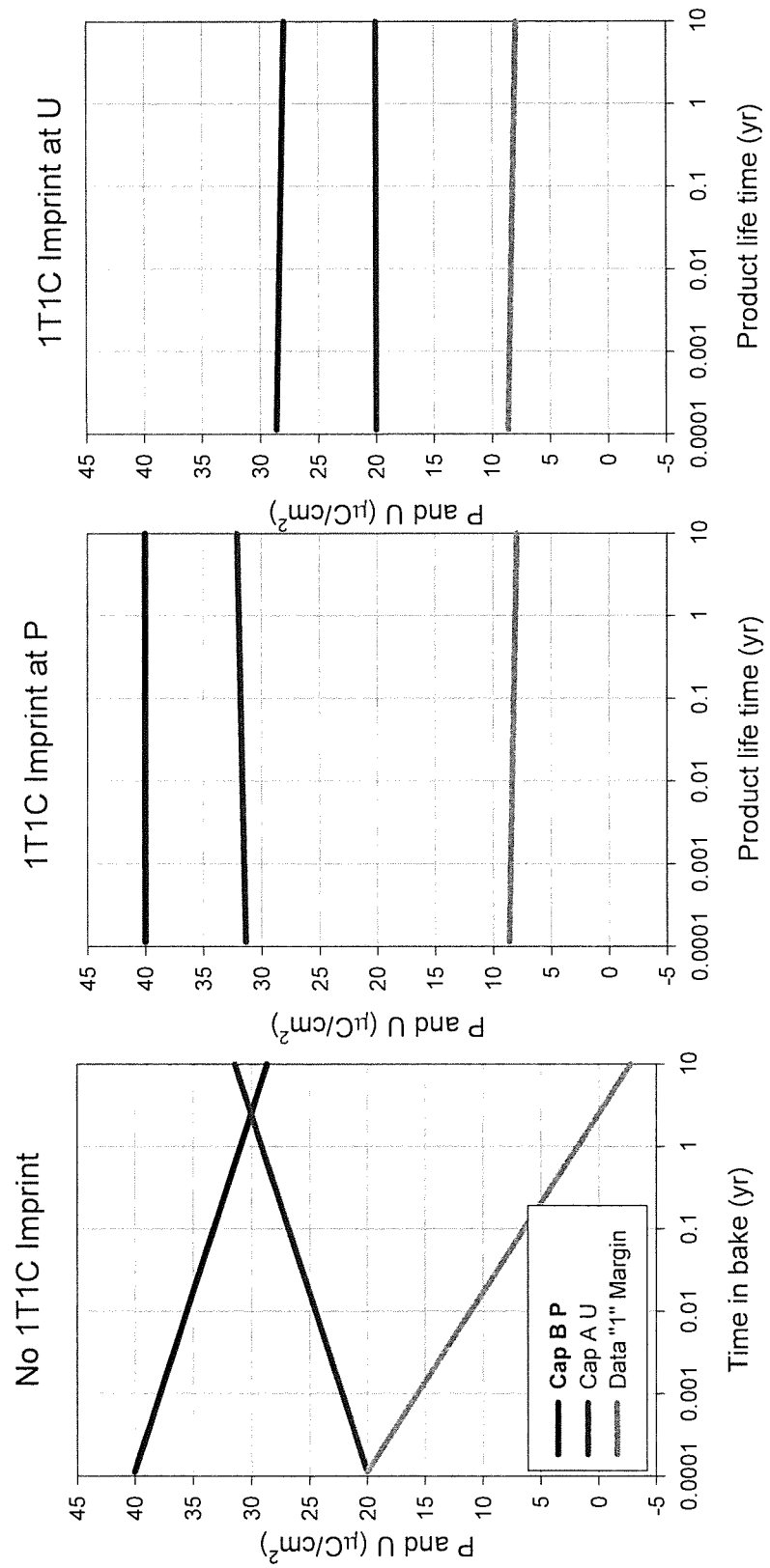

METHOD FOR IMPROVING DATA RETENTION IN A 2T/2C FERROELECTRIC MEMORY

BACKGROUND OF THE INVENTION

The present invention relates to ferroelectric memories, and more particularly to improving the data retention of a 2T/2C memory device.

Referring now to FIG. 1, a 1T/1C (One Transistor, One Capacitor) memory cell 100 is shown. As is known in the art, memory cell 100 includes a transistor 102 having a gate coupled to a word line node WL and a source/drain coupled to a bit line node BL. Another source/drain of transistor 102 is coupled to ferroelectric capacitor 104, which in turn is coupled to a plate line node PL.

Referring now to FIG. 2, a 2T/2C (Two Transistor, Two Capacitor) memory cell 200 is shown. As is known in the art, memory cell 200 includes a first transistor 202 having a gate coupled to a first word line node WL1 and a source/drain coupled to a first bit line node BL1. Another source/drain of transistor 202 is coupled to a first ferroelectric capacitor 204, which in turn is coupled to a plate line node PL. Memory cell 200 also includes a second transistor 206 having a gate coupled to a second word line node WL2 and a source/drain coupled to a second bit line node BL2. Another source/drain of transistor 206 is coupled to a second ferroelectric capacitor 208, which in turn is coupled to the plate line node PL.

Referring now to FIG. 3, a hysteresis loop associated with a ferroelectric capacitor of a memory cell is shown. The hysteresis loop is produced by plotting polarization versus applied voltage. In FIG. 3, the P polarization term is defined as the change in polarization from a negative remanent polarization (point A in the hysteresis loop) to a positive voltage induced polarization (point B in the hysteresis loop) and the U polarization term is defined as the change in polarization from a positive remanent polarization (point C in the hysteresis loop) to a positive voltage induced polarization (point B in the hysteresis loop). Note that the P term is greater than the U term. There are actually four polarization terms: Pss (P same state, which is defined as a P term measured from a ferroelectric capacitor imprinted at a negative remanent polarization state), Pos (P opposite state, which is defined as a P term measured from a ferroelectric capacitor imprinted at a positive remanent polarization state), Uss (U same state, which is defined as a U term measured from a ferroelectric capacitor imprinted at a positive remanent polarization state), and Uos (U opposite state, which is defined as a U term measured from a ferroelectric capacitor imprinted at a negative remanent polarization state). (Psw)os is defined as Pos−Uos.

The "second half time effect" is shown in FIG. 4. The P term (Pos=P opposite state) and U term (Uss=U same state) are plotted versus baking time in years. It can be clearly shown in FIG. 4 that most of the reduction in the P term occurs in the first ten years, and only a small portion of the reduction in the P term occurs in the next ten years. The following observations can be made regarding FIG. 4: Pos=40−1*ln(t), wherein t is time in hours. Note that time is given in hours in the graph of FIG. 4, wherein 8760 hours equals one year and 87600 hours equals ten years. Both notations are added in the plot. When t=87600 hours or ten years Pos=28.6 μC/cm$^2$; when t=twenty years, Pos=27.9 μC/cm$^2$. During the first ten years, there is a 28.5% reduction in the Pos term and during the second ten years there is only a 1.75% reduction.

Referring now to the table shown in FIG. 5, certain observations, assumptions, and conclusions can be made regarding the performance of a 2T/2C memory cell. The Pss and Uss are constant terms during imprint because the polarity of internal bias is parallel to that of polarization. Imprint recovery takes at least the same amount of time as imprint at the same temperature, because imprint and imprint recovery both are controlled by the same charged defects migration mechanism. ΔPos=−ΔUos based on capacitor level data, because the decrease in Pos is due to the relaxation back switching. The back switched portion of P is the source of increase in Uos. The Pos, Uos, and (Psw)os (=Pos−Uos) terms are linear functions of logarithmic time. The charge equation for the Pos term is Pos=40−1*ln(t), wherein t is time in hours. The charge equation for the Uos term is Uos=20+1*ln(t), wherein t is time in hours. The charge equation for (Psw)os is (Psw)os=20−2*ln(t), wherein t is time in hours. The rate for (Psw)os is 10%, which means that it is not an appropriate material for a ferroelectric memory. At 10 years, (Psw)os=−2.76 μC/cm$^2$. This material has no ten year retention if used as 2T/2C ferroelectric memory without the enhancement in the present invention.

The conventional performance of a 2T/2C ferroelectric memory cell is described in further detail below with respect to FIG. 6. If parts are imprinted as a conventional 2T/2C memory cell during production as screening, the lifetime of parts is shortened due to opposite state margin degradation. This is clearly shown in FIG. 6. Note that the data margin for opposite state charge terms is zero at about two years. For materials in this case study, the opposite state retention of parts is only 1808 hours (0.2 year) assuming a minimal sense margin of 5 μC/cm$^2$. After ten years the opposite state margin is actually negative.

FIG. 6 illustrates the conventional screening process that imprints the capacitors A and B. The retention lifetimes are shortened due to the fact that both of the capacitors contribute to the degradation. Pos from capacitor A is lower and Uos from capacitor B is higher. Thus, the signal margin of a 2T/2C (Psw)os is largely reduced and the retention lifetime is shortened. The table of FIG. 6 defines the relationship between the external data "0" and "1" and the internal polarization terms of capacitor A and B. For example, the P term from capacitor A and the U term from capacitor B is the signal margin of an external data "0". Then the margin for a data "1" is the P term from capacitor B and the U term from capacitor A. The definitions of "1" and "0" are interchangeable. When P−U>5 μC/cm$^2$, the part works properly. When P−U<5 μC/cm$^2$, the part fails. FIG. 6 describes the case that Pss−Uss is always 20 μC/cm$^2$, and thus the part never fails data "0". However, Pos−Uos=5 μC/cm$^2$ at 1808 hours, thus the retention life is only 1808 hour for data "1".

What is desired, therefore, is a method for improving data retention in a 2T/2C ferroelectric memory beyond the time limits on the order shown in FIG. 6.

SUMMARY OF THE INVENTION

A method for improving data retention in a 2T/2C ferroelectric memory according to the present invention includes baking a ferroelectric memory configured to operate as an array of 1T/1C memory cells for a period of time, and then configuring the ferroelectric memory to function as an array of 2T/2C memory cells, wherein the baking pre-imprints the ferroelectric capacitors in the ferroelectric memory and stabilizes a 2T/2C opposite state margin and enhances data retention. The baking serves as a heat treatment bake and as a screen bake.

A bake flow for a ferroelectric memory including memory cells configurable as either 2T/2C memory cells or 1T/1C memory cells according to the present invention includes performing a 2T/2C wafer functionality test, writing a "U" polarization into the 2T/2C memories cells as two 1T/1C memory cells, baking the wafers for a period of time, and packaging the wafers into individual memory parts. A 2T/2C functionality test is then performed on the packaged individual memory parts.

A bake flow for a ferroelectric memory including memory cells configurable as either 2T/2C memory cells or 1T/1C memory cells according to the present invention includes performing a 2T/2C wafer functionality test, writing a "P" polarization into the 2T/2C memories cells as two 1T/1C memory cells, baking the wafers for a period of time, and packaging the wafers into individual memory parts. A 2T/2C functionality test is then performed on the packaged individual memory parts.

A memory circuit for configuring an array of memory cells for either 1T/1C operation or 2T/2C operation according to the present invention includes a plurality of sense amplifiers, a configurable reference circuit coupled to a logic circuit, a memory array, and a column decoder, wherein the plurality of sense amplifiers, the reference circuit, the memory array, and the column decoder are coupled together through a bit line and a complementary bit line, and wherein the logic circuit can configure the reference circuit for 1T/1C operation or 2T/2C operation. The reference circuit includes a first transistor coupled to a first non-configurable reference circuit for receiving a first control signal from the logic circuit and a second transistor coupled to a second non-configurable reference circuit for receiving a second control signal from the logic circuit. The first and second non-configurable reference circuits each include a ferroelectric capacitor. The logic circuit includes an operational mode control signal input, a least significant bit address control signal input, a word line control signal input, a plate line control signal input, an even word line signal output, an odd word line signal output, and a plate line signal output. The memory array includes a first transistor coupled to a first ferroelectric capacitor, and a second transistor coupled to a second ferroelectric capacitor, wherein the first transistor is coupled to the bit line, and the second transistor is coupled to the complementary bit line.

BRIEF DESCRIPTION OF THE DRAWINGS

The accompanying drawings, which are incorporated in and constitute a part of this specification, illustrate embodiments of the invention and together with the description, serve to explain the principles of the invention. In the figures:

FIG. 5 is a table of the Pss, Pos, Uss, Uos, (Psw)ss, and (Psw)os polarization terms of a 2T/2C memory cell at various bake times;

FIGS. 7A-C are graphs associated with a memory cell pre-baked as a 1T/1C memory cell at polarization P and used as a 2T/2C memory cell according to the present invention;

FIGS. 9A-C are graphs associated with a 2T/2C memory cell showing the effects of no 1T/1C imprint, 1T/1C imprint at P, and 1T/1C imprint at U;

DETAILED DESCRIPTION

In general, the method of the present invention is used to bake ferroelectric memory parts as a 1T/1C memory cell for the equivalent of a certain number of years, and then to make these parts function as a 2T/2C memory. This bake serves as a heat treatment bake and a screen bake. This 1T/1C bake pre-imprints the ferroelectric capacitors and stabilizes the 2T/2C opposite state margin and enhances data retention.

A first method implementing the method of the present invention is now described with reference to FIGS. 7A-7C. The first method of the present invention pre-bakes a memory cell as a 1T/1C memory cell at polarization P (FIG. 7A), which is then used as a 2T/2C memory cell (FIGS. 7B and 7C). For a 2T/2C memory data zero, ferroelectric capacitor A is at P and ferroelectric capacitor B is at U. For a 2T/2C memory data one, ferroelectric capacitor A is at U and ferroelectric capacitor B is at P. If the parts are baked as a 1T/1C memory cell at P, the margin of 2T/2C data zero is increasing at field due to Uos recovery. The margin of a 2T/2C opposite state is slightly reduced due to the Uos second half time effect and constant P. For materials in this case study, the opposite state retention of parts is longer than ten years assuming a minimal sense margin of 5 $\mu C/cm^2$. It is important to note that the same material failed at 1080 hours if screened by conventional 2T/2C.

Figure 1:
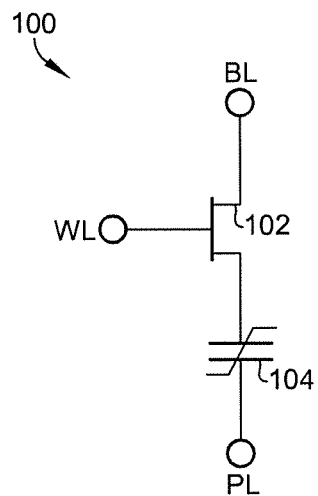
FIG. 1 is a schematic diagram of a 1T/1C memory cell according to the prior art.
Figure 2:
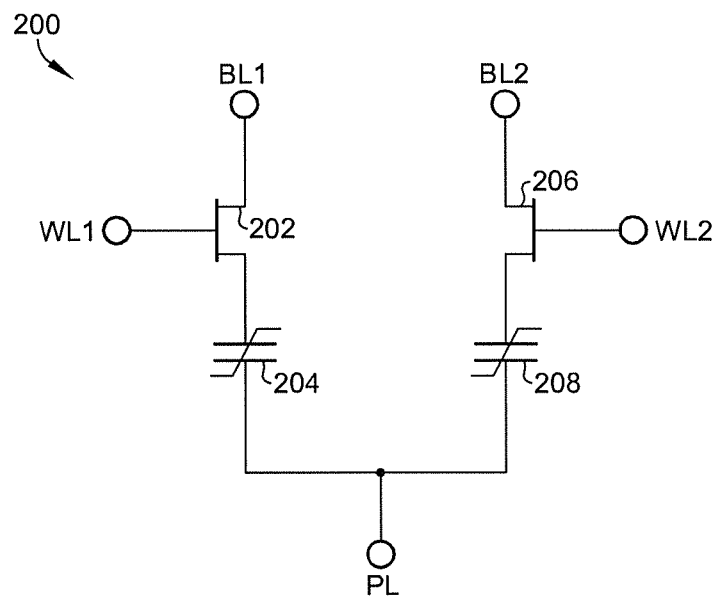
FIG. 2 is a schematic diagram of a 2T/2C memory cell according to the prior art.
Figure 3:
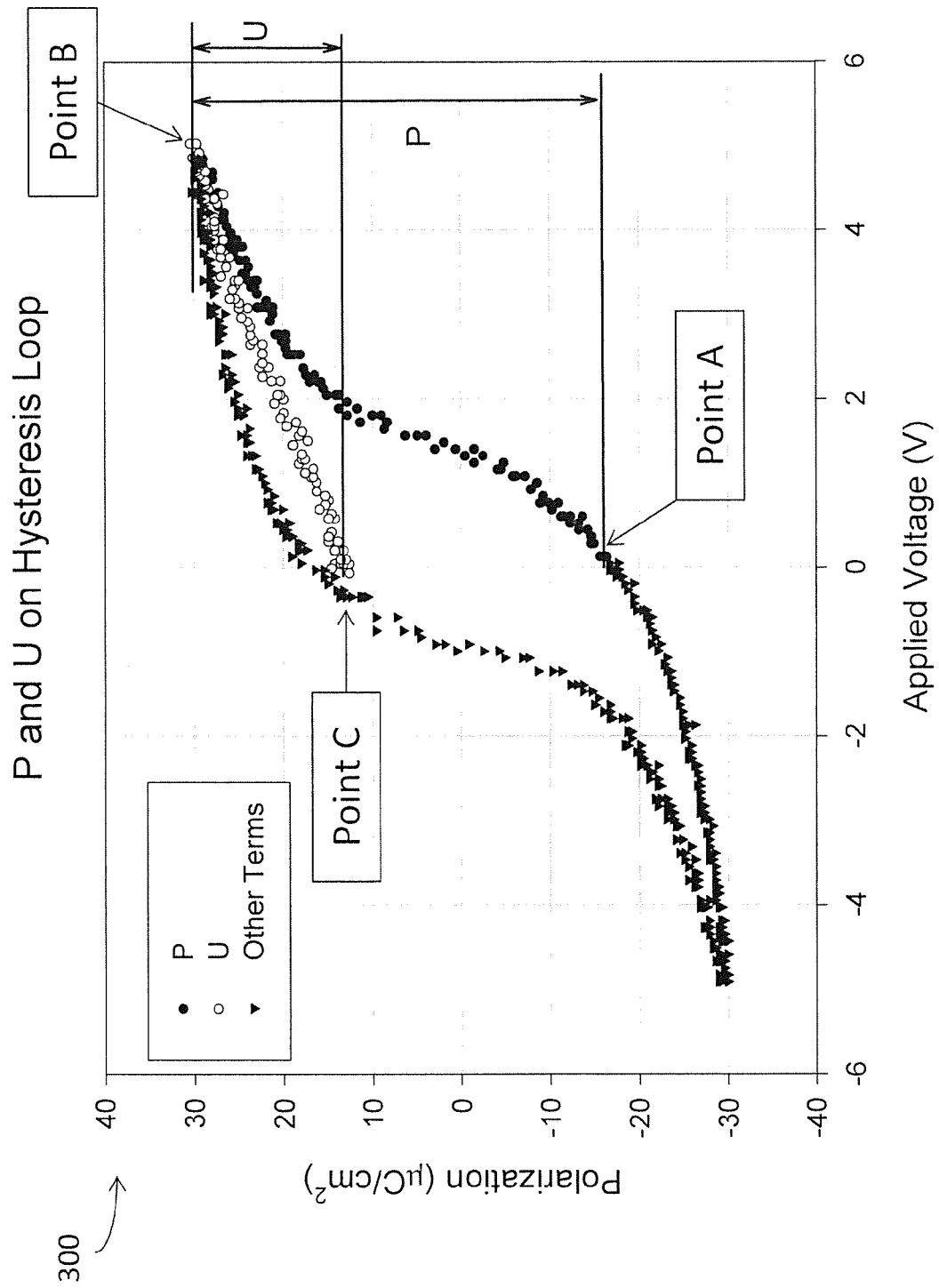
FIG. 3 is a diagram of a hysteresis loop associated with a ferroelectric capacitor according to the prior art.
Figure 4:
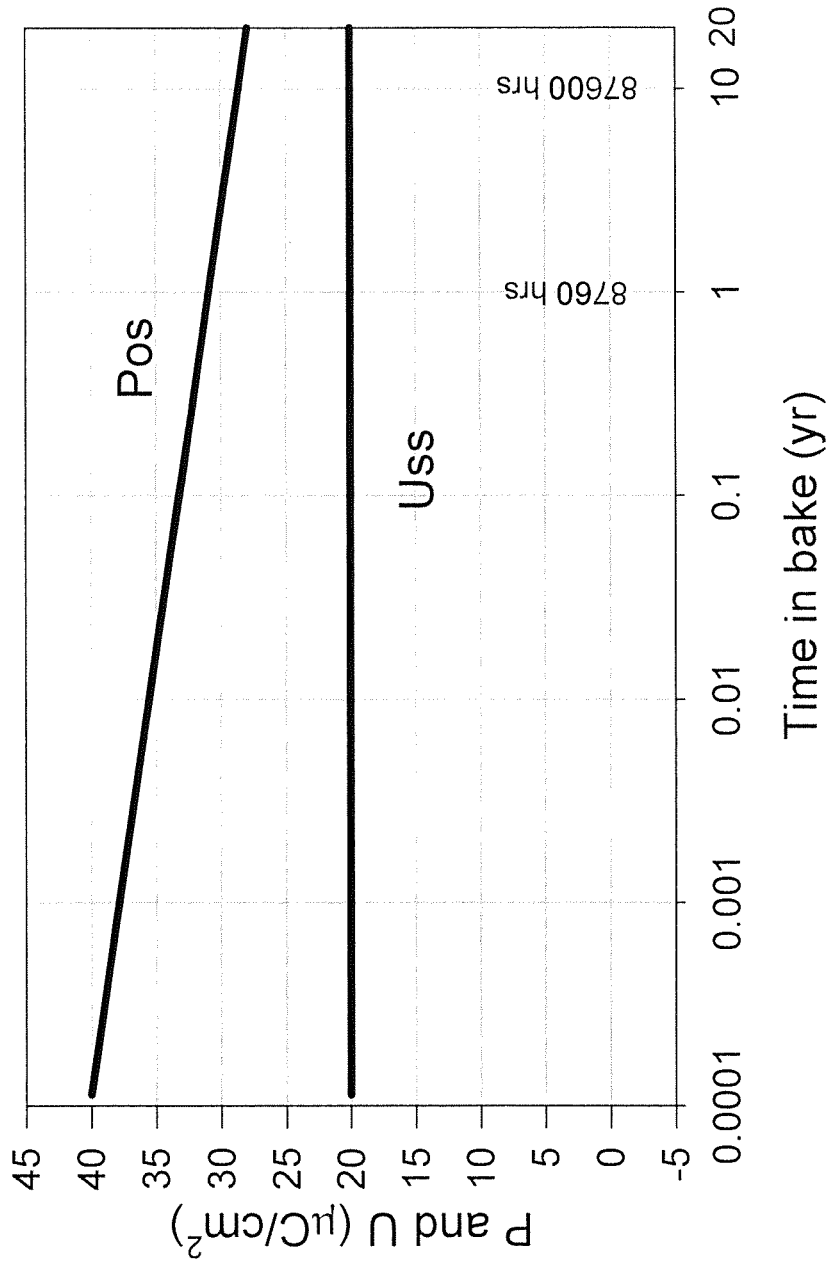
FIG. 4 is a plot of the "second half time effect" associated with the performance of a 2T/2C ferroelectric memory cell.
Figure 6:
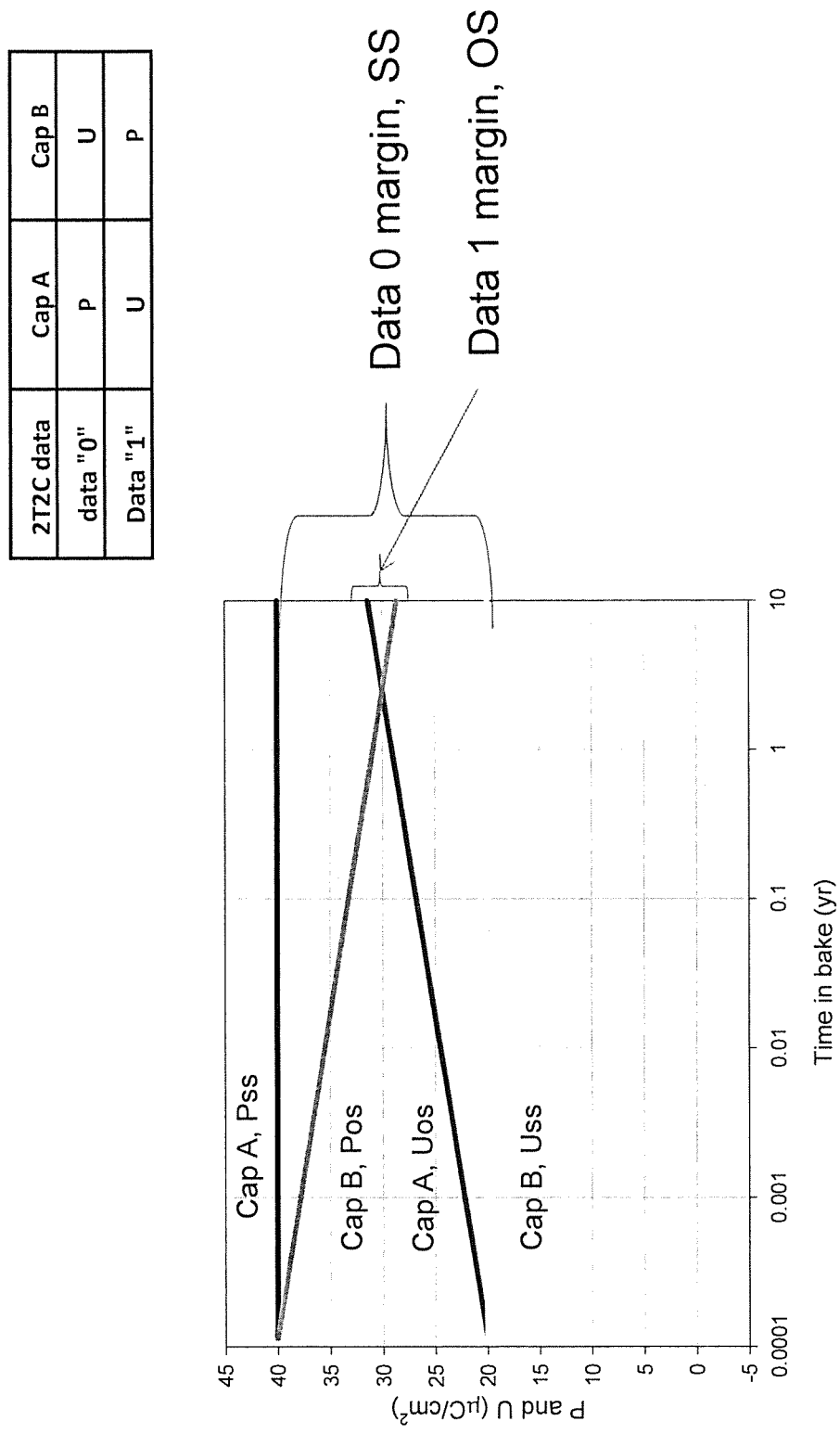
FIG. 6 is a graph of the Pss, Pos, Uss, and Uos polarization terms of a 2T/2C memory cell plotted versus bake time.
Figures 8A, 8B, 8C:
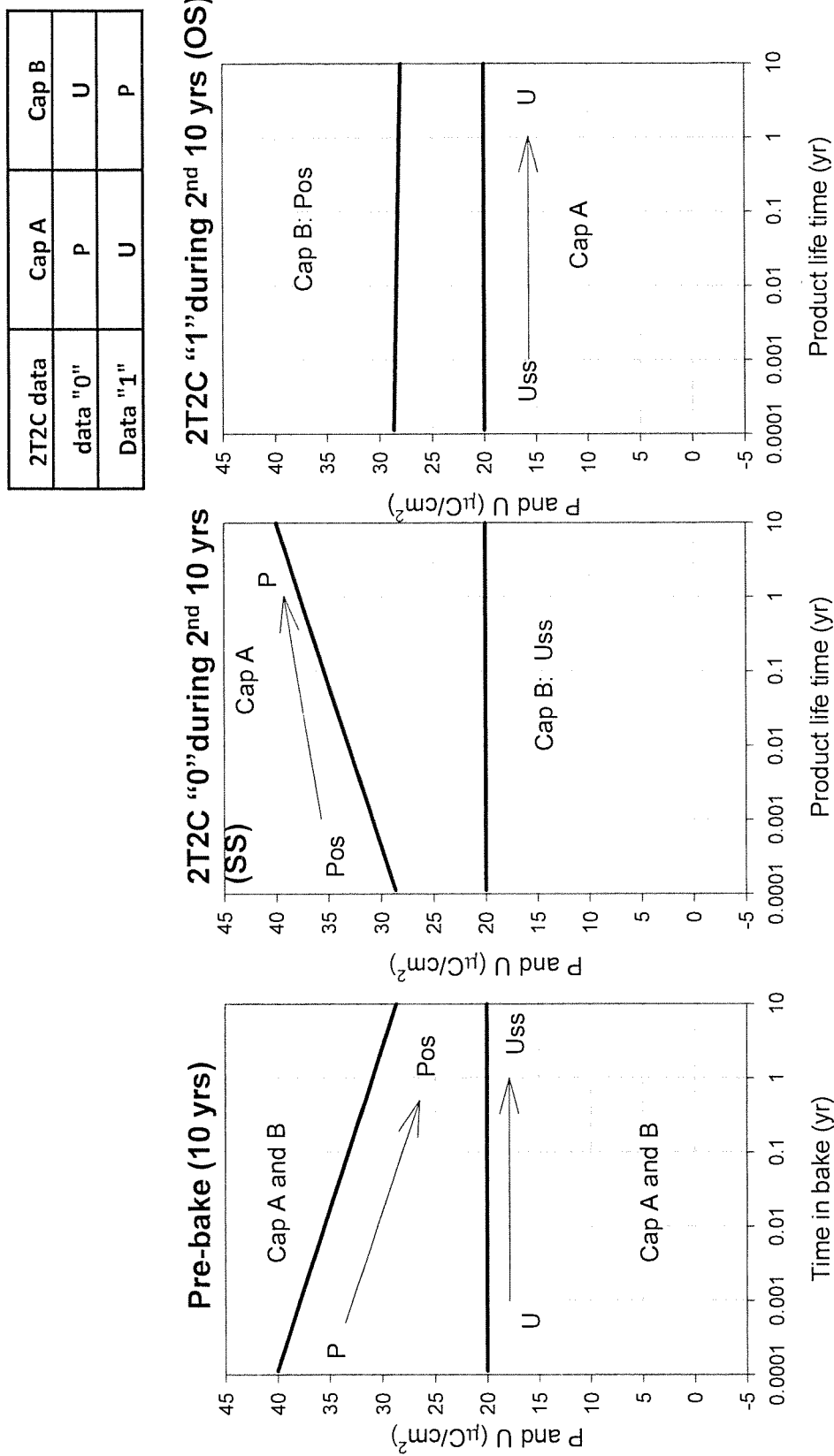
FIGS. 8A-C are graphs associated with a memory cell pre-baked as a 1T/1C memory cell at polarization U and used as a 2T/2C memory cell according to the present invention.

A second method implementing the method of the present invention is now described with reference to FIGS. 8A-8C. If the memory parts are pre-baked as a 1T/1C memory cell at polarization U (FIG. 8A), the margin of 2T/2C same state is increasing at field due to recovery (FIG. 8B). The margin of 2T/2C opposite state is slightly reduced due to the Pos second half time effect and constant U (FIG. 8C). For materials in this case study, the opposite state retention of parts is longer than ten years assuming minimal sense margin of 5 $\mu C/cm^2$.

The 2T/2C data one margin comparison is shown in FIG. 9. In FIG. 9A, the P and U polarization terms, as well as the data one margin are plotted versus bake time. For no 1T/1C imprint, it can again be seen that the data one margin decreases significantly with time up to ten years. In FIG. 9B, for a 1T/1C imprint at the P polarization, the capacitor B, P polarization is constant at about 40 $\mu C/cm^2$, the capacitor A, U polarization is constant at about 32 $\mu C/cm^2$, and the data one margin is constant at about 9 $\mu C/cm^2$. In FIG. 9C, for a 1T/1C imprint at the U polarization, the capacitor B, P polarization is constant at about 28 $\mu C/cm^2$, the capacitor A, U polarization is constant at about 20 $\mu C/cm^2$, and the data one margin is also constant at about 9 $\mu C/cm^2$. Thus, the signal margin is roughly constant throughout a ten year product life term.

The 1T/1C imprint bake can be performed at various steps in the memory manufacturing process. The 1T/1C bake can be performed before packaging at wafer level. This is easy to carry out and a large temperature range can be used. Alternatively, the packaging of the memory parts can itself be used as the 1T/1C bake. Finally, if desired, the packaged parts can be baked as 1T/1C devices. A combination of two or all three of these bakes can also be performed.

The following considerations should be taken into account regarding the parameters of the 1T/1C bake. The longer the bake, the lower the data margin as a 2T/2C memory to start with, but there is less degradation during the 2T/2C product lifetime. Conversely, if the 1T/1C bake is too short, the larger the 2T/2C initial data margin, but there is more degradation during the product lifetime. To achieve the best screening effect, the longer the bake the better. The 1T/1C bake time/temperature is equivalent to the 2T/2C retention specification. The 1T/1C bake time and temperature are selected to make sure during the lifetime of 2T/2C, one capacitor is always in the timeframe of recovering. For example, if the retention specification of 2T/2C product is ten years at 85° C., the 1T/1C bake temperature and time are 180° C. and 26 hours assuming activation energy of 1.2 eV.

The actual parameters to take into consideration for the 1T/1C bake are the write voltage, the bake temperature, and the bake time.

Other considerations are also important. For example, the bake state and the package state should be the same, otherwise the pre-imprint effects will cancel each other out. The package stress is equivalent to 180° C. for four hours. If a 180° C./26 hours 1T/1C pre-imprint is needed, 22 hours of 1T/1C bake is enough if the package state is the same as the bake state. If the package state is opposite to the bake state, a longer baking time is needed to compensate the package-induced imprint. Besides imprint, hydrogen damage also occurs during package and should be minimized. Based on the teachings of U.S. Pat. No. 6,238,933 entitled "Polarization Method for Minimizing the Effects of Hydrogen Damage on Ferroelectric Thin Film Capacitors", there is a strong polarization polarity effect on hydrogen-induced degradation. Experiments are needed to determine which term (P or U) should be used during the bake and packaging. The selection of P or U might be different based on the ferroelectric structure and ferroelectric processing. A 2T/2C margin screen can be done post 1T/1C bake to screen out all P weak bits (or U weak bits). If there are redundancy bits, a repair can be performed after the 1T/1C bake and package to maximize the usage of redundancy. Redundancy bits are used to replace weak bits that failed the margin specification during the test. This test step is called "repair". The best time to perform a repair is post 1T/1C bake, since the real weak bits are repaired. Based on the analysis, a 1T/1C bake at U or P will enhance 2T/2C parts retention greatly. It is important to note that the approach of the present invention only works for 2T/2C parts which have the option to be configured as 1T/1C parts. The method of the present invention does not actually work with 1T/1C only parts. The present invention is directed at taking a 2T/2C part, setting it to function as a 1T/1C part, baking and imprint, then switching the part back to 2T/2C functionality.

Figure 10:
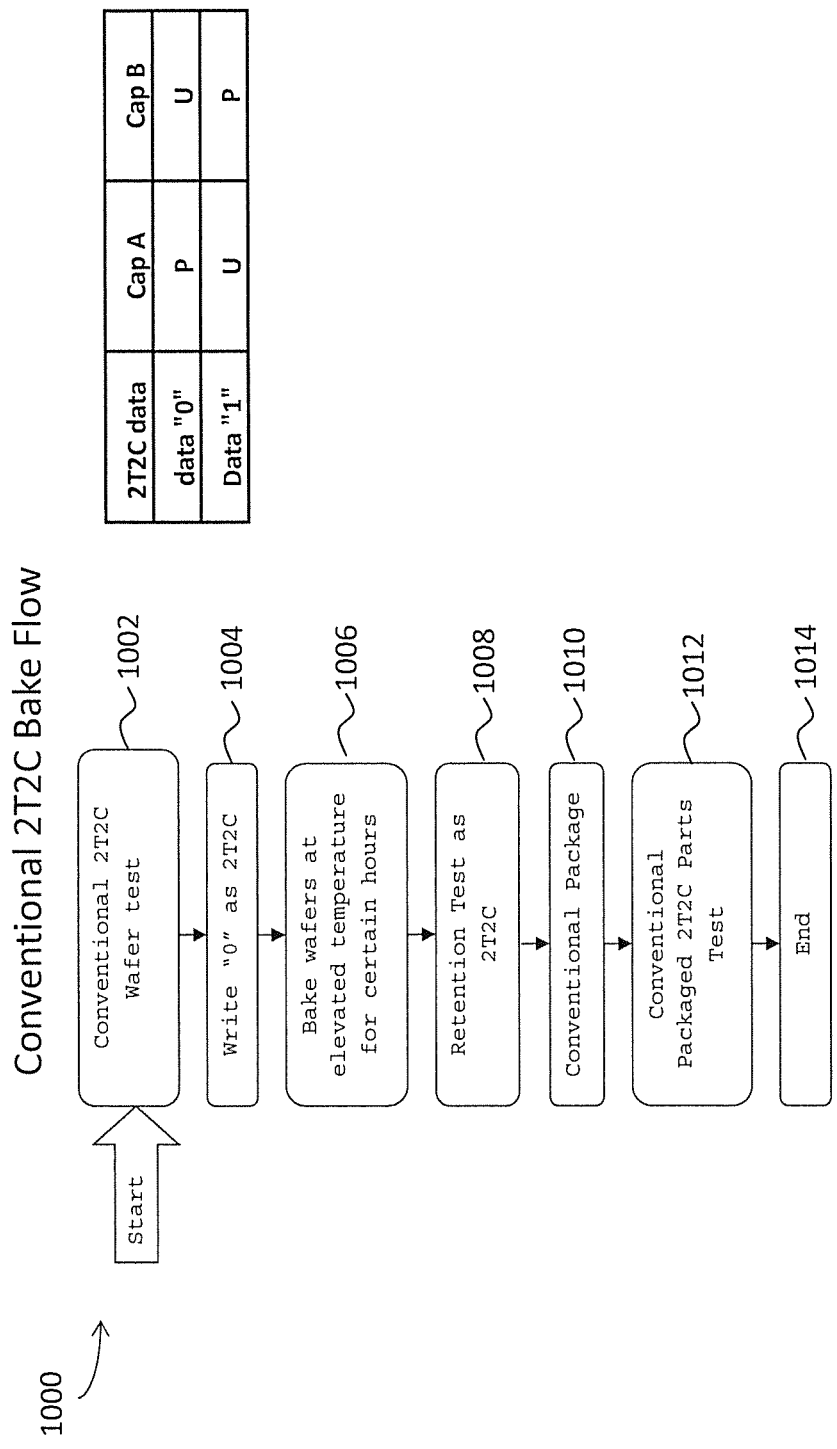
FIG. 10 is a flow chart of a conventional 2T/2C bake flow according to the prior art.

Referring now to FIG. 10, a conventional 2T/2C bake flow 1000 is shown. The bake flow 1000 starts at step 1002 with a conventional 2T/2C wafer test to screen out weak retention parts. At step 1004, a zero data state is written into the memory cells. At step 1006, the wafers are baked at an elevated temperature for a predetermined period of time. At step 1008, a data retention test is performed which consists of read "0", write "1", and read "1" on a conventionally operated 2T/2C memory. At step 1010, the memories are conventionally packaged. At step 1012, the packaged parts are tested. The flow is then ended at step 1014.

Figure 11:
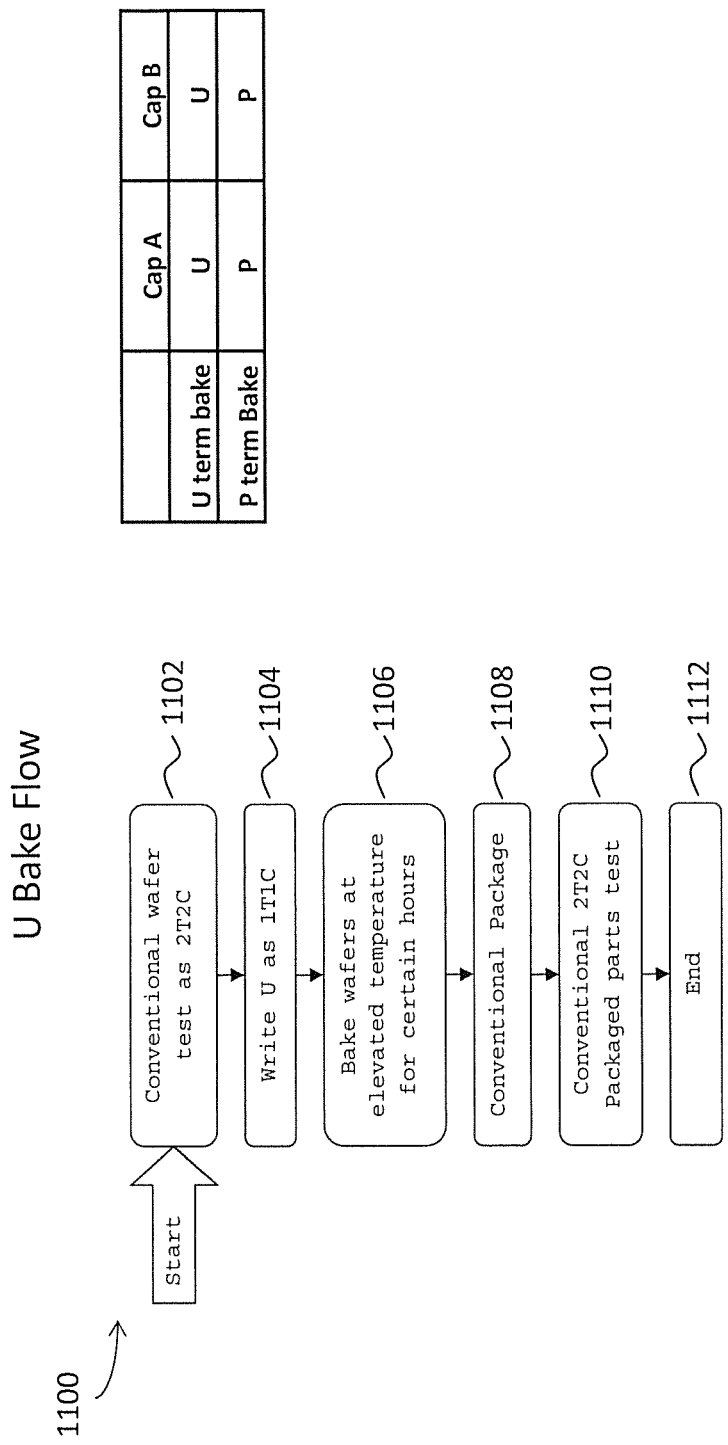
FIG. 11 is a flow chart of a "U" bake flow according to the present invention.

Referring now to FIG. 11, the U bake flow 1100 according to the present invention is shown. At step 1102, the wafer is conventionally tested for 2T/2C memories. At step 1104, a U polarization is written into the 2T/2C memories cells as two 1T/1C memory cells. At step 1106, the wafers are baked at an elevated temperature for a predetermined period of time. At step 1108, the parts are packaged. At step 1110 the packaged parts are tested. The flow is then ended at step 1112.

Figure 12:
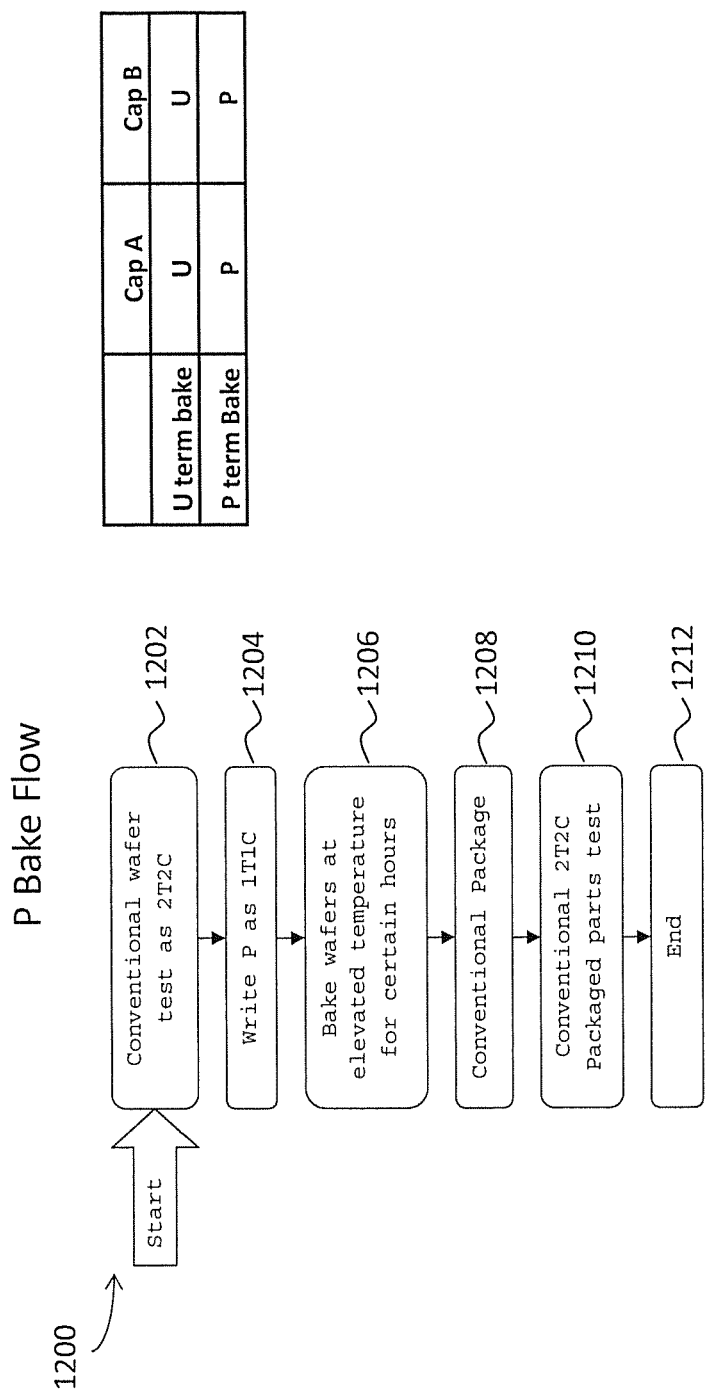
FIG. 12 is a flow chart of a "P" bake flow according to the present invention.

Referring now to FIG. 12, the P bake flow 1200 according to the present invention is shown. At step 1202, the wafer is conventionally tested for 2T/2C memories. At step 1204, a P polarization is written into the 2T/2C memories cells as two 1T/1C memory cells. At step 1206, the wafers are baked at an elevated temperature for a predetermined period of time. At step 1208, the parts are packaged. At step 1210 the packaged parts are tested. The flow is then ended at step 1212.

Figure 13A:
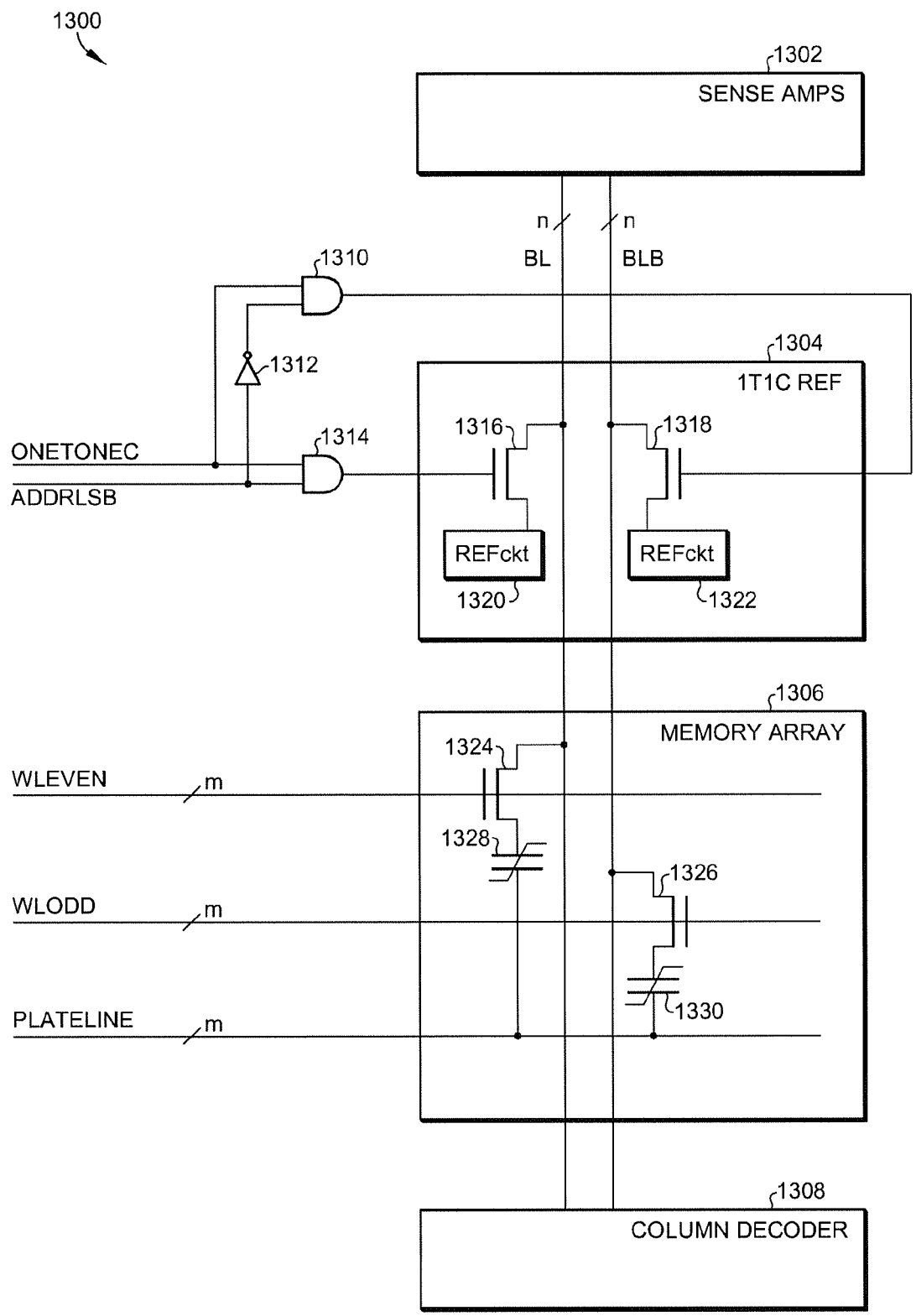
FIG. 13A is a schematic diagram of a portion of a memory circuit that can be used with the method of the present invention.

Referring now to FIG. 13A, a memory array circuit 1300 is shown, that is capable of implementing both the P and U bake flows according to the present invention. Circuit 1300 includes sense amplifiers 1302, a 1T/1C reference circuit 1304, a memory core 1306, and a column decoder 1308. Bit lines BL and BLB couple together the sense amplifiers 1302, the reference circuit 1304, the memory core 1306, and the column decoder 1308. The reference circuit 1304 includes reference sub-circuits 1320 and 1322, which receive control signals via a digital circuit including logic gates 1310 and 1314, and inverter 1312. The control signals for the digital circuit includes a ONETONEC control signal, which is low for 2T/2C operation and high for 1T/1C operation and an ADDRLSB control signal, which couples a reference sub-circuit to the appropriate bit line if in 1T/1C operation mode. Reference circuit 1304 further includes reference circuits 1320 and 1322, which generate a reference voltage for sensing if in 1T/1C mode. Memory array 1306 includes at least one ferroelectric memory cell that can be configured as two independent 1T/1C memory cells, or a conventional 2T/2C memory cell. Transistor 1324 is coupled to an even word line WLEVEN and transistor 1326 is coupled to an odd word line WLODD as shown. Both ferroelectric capacitors 1328 and 1330 are coupled to a common plate line PLATELINE.

Figure 13B:
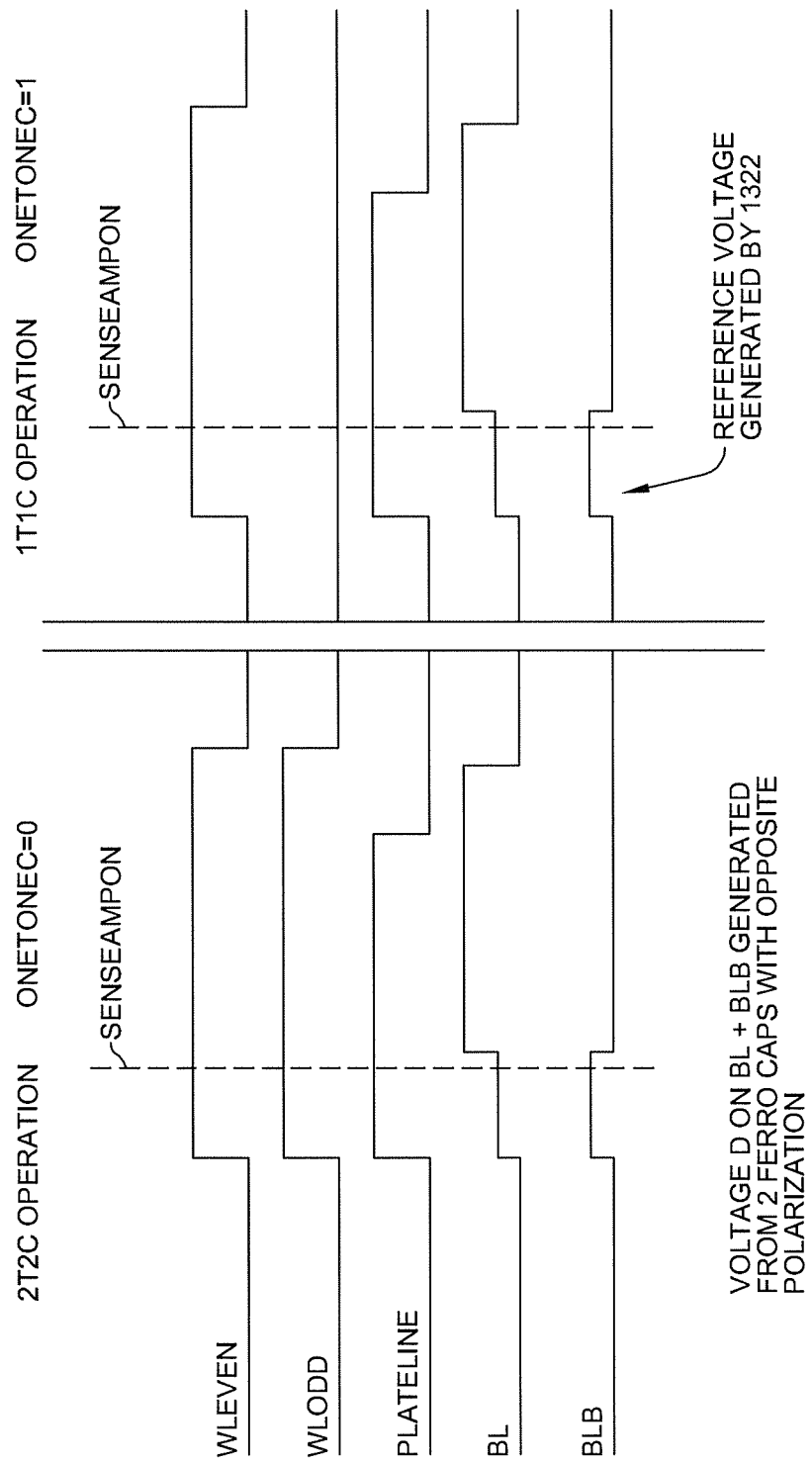
FIGS. 13B-D are timing diagrams associated with the memory circuit of FIG. 13A.
Figure 13C:
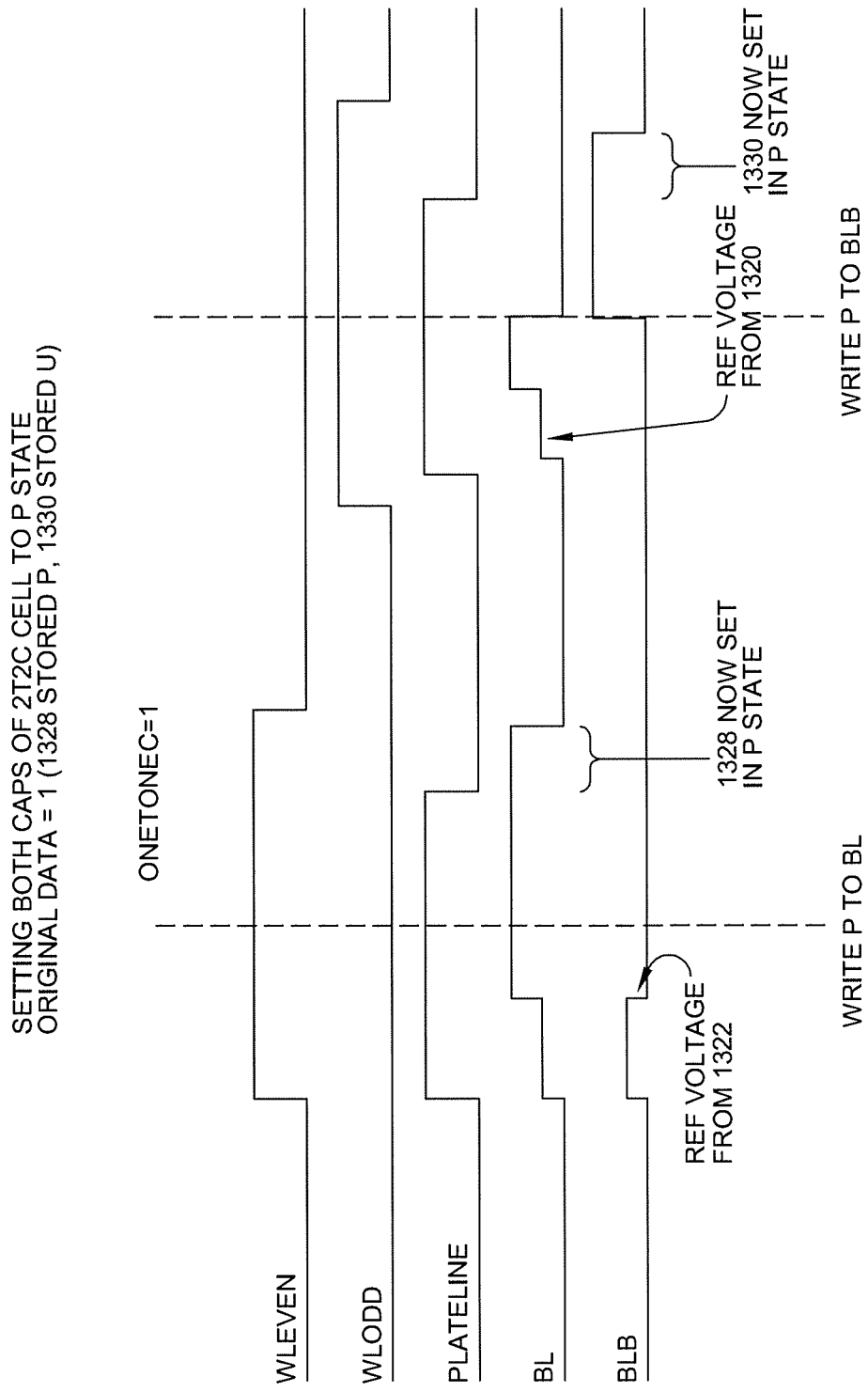
Figure 13D:
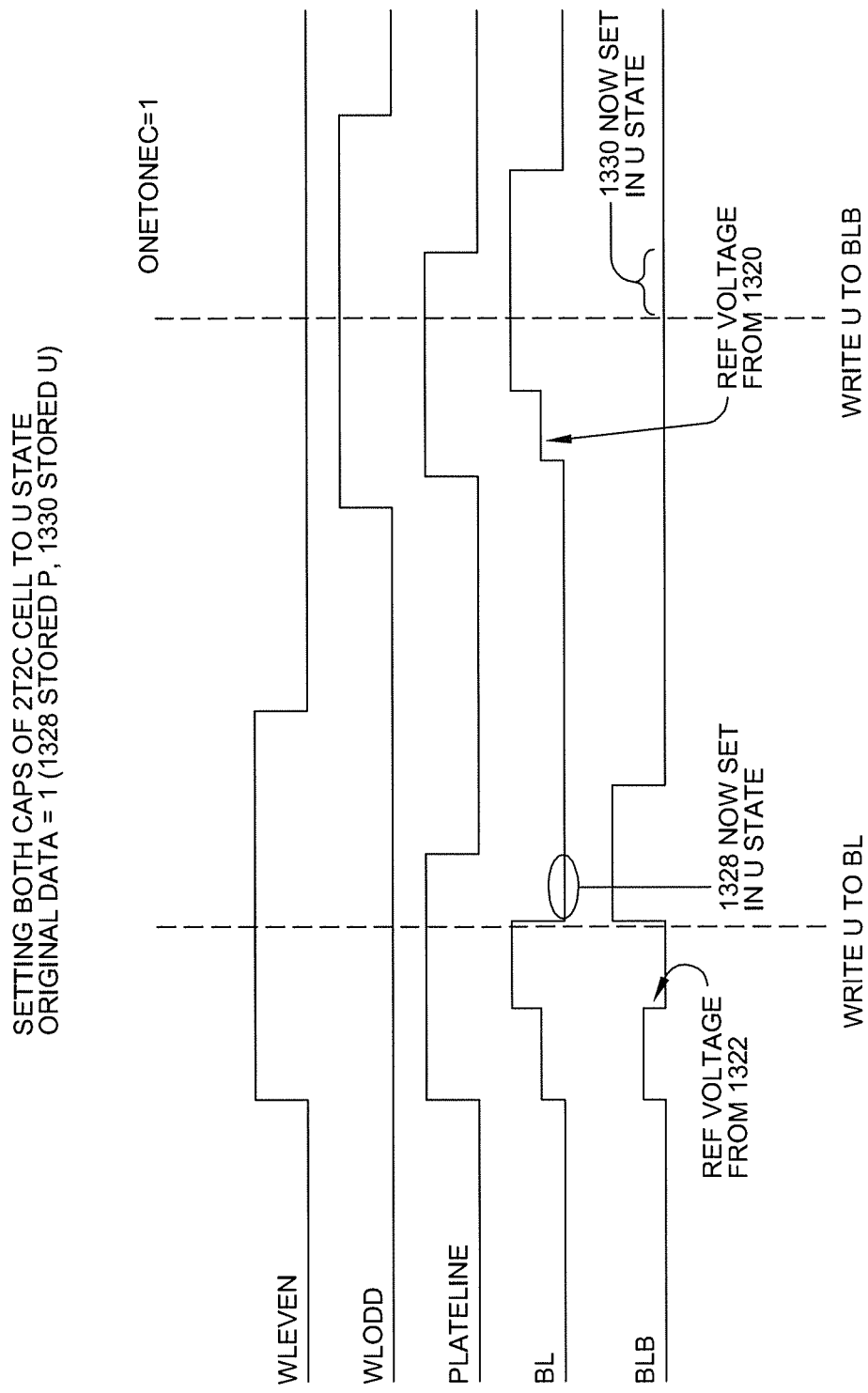

FIG. 13A is a schematic diagram of a portion of a memory circuit that can be used with the method of the present invention and FIGS. 13B-D are timing diagrams associated with the memory circuit of FIG. 13A.

Figure 14:
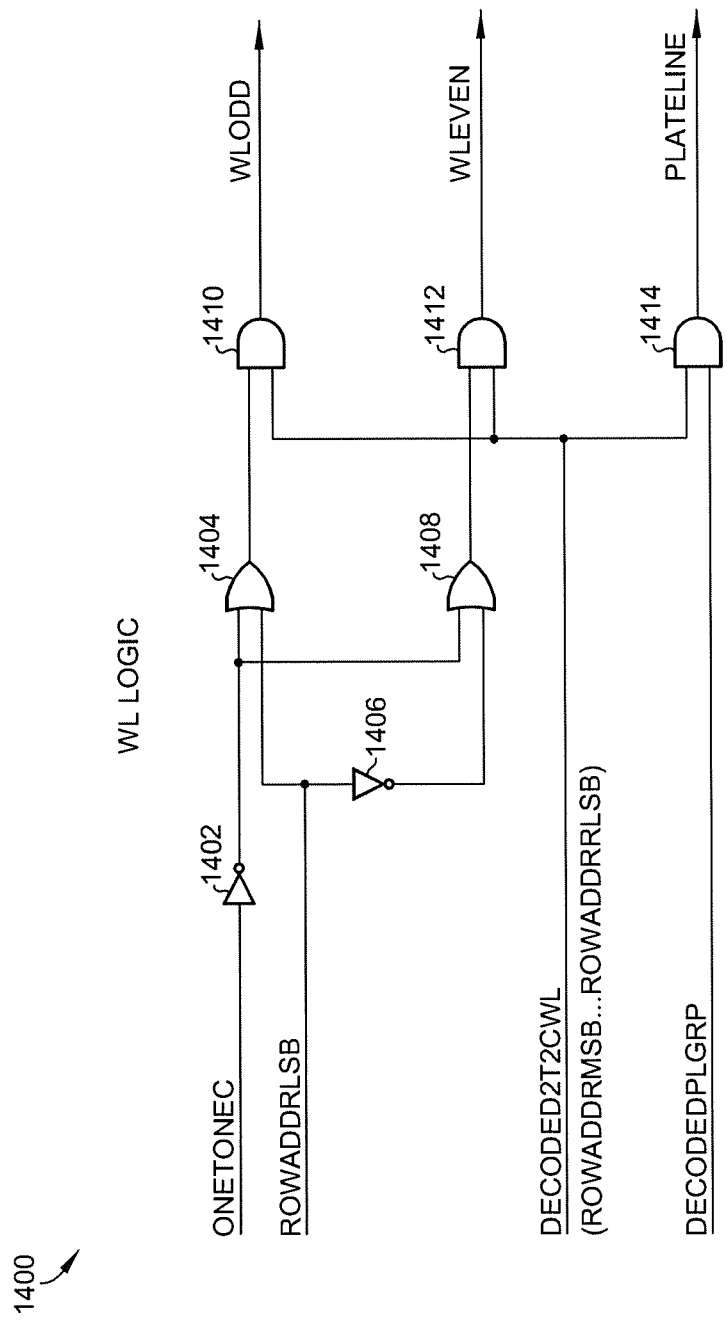
FIG. 14 is a digital circuit schematic of a circuit providing signals to the memory circuit of FIG. 13A.

Additional word line control circuitry 1400 is shown in FIG. 14. The input control signals are ONETONEC and ROWADDRLSB as previously described. Additional input control signals are DECODED2T2CWL and DECODEDPLGRP, which represent a decoded word line pair based on row address bits and a decoded plate line signal. The word line control circuit includes inverters 1402 and 1406, and logic gates 1404, 1408, 1410, 1412, and 1414, as shown. Logic gate 1410 generates the WLODD control signal, logic gate 1412 generates the WLEVEN control signal, and logic gate 1414 generates the PLATELINE control signal. This circuit selects just one of "m" word line pairs and plate lines to be activated for the memory operation. If ONETONEC is "0", then both WLEVEN and WLODD are activated to provide 2T/2C cell operation; if ONETONEC is "1", then the ROWADDRLSB selects just one word line of the pair to be activated.

The operation mode (2T/2C versus 1T/1C) is determined by a static timing control signal. The operational mode is set through a test mode operation or by driving an optional pad, which latch a state bit (ONETONEC) for controlling the memory operation.

Referring again to FIG. 13A, it should be noted that there are "m" even word lines, "m" odd word lines, and "m" plate lines. There are "n" bit line pairs designated BL and BLB. In the 2T/2C operational mode, both WLEVEN and WLODD are driven so that both ferroelectric capacitors drive their complementary data onto BL and BLB. In this case, the switches inside the reference block remain off (ONETONEC=0) and the sense amplifiers work with the complementary data. This data is then restored to both capacitors later in the memory operation.

To write the array with 1T/1C data, the part is put into the 1T/1C mode of operation (ONETONEC=1). In this mode, only one of WLODD or WLEVEN is turned on for each access based on the value of ROWADDRLSB. This allows writing to each individual capacitor with the desired value (P or U) and at specific voltages. Since the opposite word line is OFF, its associated capacitor is unaffected by the restore operation when the 1T/1C write occurs.

Having described and illustrated the principles of the invention in a preferred embodiment thereof, it is appreciated by those having skill in the art that the invention can be modified in arrangement and detail without departing from such principles. For example, the exact voltages, baking times and baking temperatures can of course be changed depending on the type of ferroelectric materials and processes being used in a particular application. The circuit topology and associated timing used for providing the 1T/1C and 2T/2C functionality required by the present invention can also be altered as may be required to interface with a particular memory part or application. We therefore claim all modifications and variation coming within the spirit and scope of the following claims.

We claim:

1. A memory circuit for configuring an array of memory cells for either

1T/1C operation or 2T/2C operation comprising:
   a plurality of sense amplifiers;
   a configurable reference circuit coupled to a logic circuit;
   a memory array; and
   a column decoder,
   wherein the plurality of sense amplifiers, the reference circuit, the memory array, and the column decoder are coupled together through a bit line and a complementary bit line, and wherein the logic circuit can configure the reference circuit for 1T/1C operation or 2T/2C operation.

2. The memory circuit of claim 1 wherein the reference circuit comprises a first transistor coupled to a first non-configurable reference circuit for receiving a first control signal from the logic circuit and a second transistor coupled to a second non-configurable reference circuit for receiving a second control signal from the logic circuit.

3. The memory circuit of claim 2 wherein the first non-configurable reference circuit comprises a ferroelectric capacitor.

4. The memory circuit of claim 2 wherein the second non-configurable reference circuit comprises a ferroelectric capacitor.

5. The memory circuit of claim 1 wherein the logic circuit comprises an operational mode control signal input.

6. The memory circuit of claim 1 wherein the logic circuit comprises a least significant bit address control signal input.

7. The memory circuit of claim 1 wherein the logic circuit comprises a word line control signal input.

8. The memory circuit of claim 1 wherein the logic circuit comprises a plate line control signal input.

9. The memory circuit of claim 1 wherein the logic circuit comprises an even word line signal output.

10. The memory circuit of claim 1 wherein the logic circuit comprises an odd word line signal output.

11. The memory circuit of claim 1 wherein the logic circuit comprises a plate line signal output.

12. The memory circuit of claim 1 wherein the memory array comprises a first transistor coupled to a first ferroelectric capacitor, and a second transistor coupled to a second ferroelectric capacitor.

13. The memory circuit of claim 11 wherein the first transistor is coupled to the bit line.

14. The memory circuit of claim 11 wherein the second transistor is coupled to the complementary bit line.

* * * * *